(12) United States Patent
Mease et al.

(10) Patent No.: US 6,992,894 B1
(45) Date of Patent: Jan. 31, 2006

(54) METHOD AND APPARATUS FOR EMI SHIELDING

(75) Inventors: Keith D. Mease, Gibbstown, NJ (US); Mark W. Wessel, Bala Cynwyd, PA (US); Grant M. Smith, Bryn Athyn, PA (US); Terry W. Louth, Narvon, PA (US); Daniel A. Jochym, Downingtown, PA (US); Ronald T. Gibbs, Paoli, PA (US)

(73) Assignee: Unisys Corporation, Blue Bell, PA (US)

( * ) Notice: Subject to any disclaimer, the term of this patent is extended or adjusted under 35 U.S.C. 154(b) by 174 days.

(21) Appl. No.: 10/390,419

(22) Filed: Mar. 17, 2003

(51) Int. Cl.
*H05K 7/20* (2006.01)
*H01L 23/40* (2006.01)

(52) U.S. Cl. ............ 361/719; 361/697; 361/799; 361/800; 257/718

(58) Field of Classification Search ........ 361/709–723, 361/697, 704, 707, 753, 799, 696, 800; 257/705–707, 257/713, 717–719; 248/510; 24/458
See application file for complete search history.

(56) References Cited

U.S. PATENT DOCUMENTS

| | | | | |
|---|---|---|---|---|
| 5,357,404 A | * | 10/1994 | Bright et al. | 361/818 |
| 5,880,930 A | * | 3/1999 | Wheaton | 361/690 |
| 5,901,040 A | * | 5/1999 | Cromwell et al. | 361/704 |
| 6,049,469 A | * | 4/2000 | Hood et al. | 361/818 |
| 6,061,235 A | * | 5/2000 | Cromwell et al. | 361/690 |
| 6,075,700 A | * | 6/2000 | Houghton et al. | 361/704 |
| 6,198,630 B1 | * | 3/2001 | Cromwell | 361/704 |
| 6,205,026 B1 | * | 3/2001 | Wong et al. | 361/704 |
| 6,219,239 B1 | * | 4/2001 | Mellberg et al. | 361/704 |
| 6,243,265 B1 | * | 6/2001 | Wong et al. | 361/704 |
| 6,430,043 B1 | * | 8/2002 | Osburn | 361/687 |
| 6,580,028 B1 | * | 6/2003 | Mellberg et al. | 174/35 R |
| 6,664,463 B1 | | 12/2003 | Treiber et al. | |
| 2002/0039285 A1 | * | 4/2002 | Hsieh et al. | 361/799 |

* cited by examiner

*Primary Examiner*—Anatoly Vortman
(74) *Attorney, Agent, or Firm*—Lise A. Rode; Mark T. Starr; RatnerPrestia LLP

(57) ABSTRACT

An apparatus and method are provided for dissipating heat from an electronic component mounted in a conductive enclosure and for shielding electromagnetic radiation generated by the electronic component. A heat sink is configured to be mounted in thermal contact with the electronic component. An electrical conductor is operatively connected to the heat sink and configured to provide electrical contact between the heat sink and a surface of the conductive enclosure, thereby at least partially shielding the electromagnetic radiation generated by the electronic component.

20 Claims, 5 Drawing Sheets

METHOD AND APPARATUS FOR EMI SHIELDING

FIELD OF THE INVENTION

The present invention generally relates to heat dissipation for electronic components and more particularly relates to an apparatus configured to dissipate heat generated by an electronic component and to provide shielding for electromagnetic radiation generated by the electronic component to prevent electromagnetic interference (EMI).

BACKGROUND OF THE INVENTION

Modern consumers demand computer systems and processors that function at continually increasing frequencies. As processor frequencies increase, the frequency of the electromagnetic emissions increases, making it more difficult to shield electromagnetic radiation generated by these high frequency processors. Electromagnetic radiation can adversely effect circuit performance, and radiate from electronic equipment to threaten circuits in nearby equipment. There are also many regulatory requirements imposed on computer systems limiting the level of electromagnetic emissions that they produce.

One common method that has been used to shield electromagnetic radiation has been to use the chassis (or enclosure) to contain the electromagnetic energy within the chassis and block the energy from escaping. This is achieved by enclosing the electronics within a grounded conductive box. This requirement, however, makes it difficult to service the electronics and to cool the electronics, as any gaps in the conductive box allow electromagnetic radiation to escape.

To service the electronics there need to be removable panels and means to access the components in the interior of the unit. This creates cracks and seams that need to be sealed to block the electromagnetic radiation generated by the processors from escaping.

Also, to meet the cooling requirements of high-speed processors, a working fluid is moved through the chassis to remove the heat. The cheapest and simplest method is often to utilize air as the working fluid. The disadvantage of using air is that it has a relatively low thermal capacitance. Thus a large amount of air needs to be moved through the chassis to maintain proper temperatures. Vents are needed in the chassis to allow air into and out of the system. These vents allow some of the electromagnetic radiation to escape the enclosure. The size of the openings needs to be controlled to contain the energy within the enclosure. As the frequency increases the size of the openings needs to decrease to maintain containment. With the high frequency of the current processors, the allowable size of an opening in the box has gotten small enough that it is becoming difficult to design cost effective containment systems. Accordingly, it is believed that it is desirable to minimize the amount of electromagnetic radiation that needs to be contained by the enclosure.

SUMMARY OF THE INVENTION

To meet this and other objectives, and in view of its purpose, the present invention provides an apparatus configured to dissipate heat from an electronic component and provide shielding for electromagnetic radiation generated by that component. It has been discovered that significant advantages can be enjoyed when electromagnetic radiation is shielded at its source. This is especially true as processor speeds increase and smaller wavelength electromagnetic signals enable electromagnetic emissions to escape through smaller apertures of the equipment enclosures in which the sources of the electromagnetic radiation are disposed.

In accordance with the invention, an exemplary apparatus comprises a heat sink configured to be mounted in thermal contact with an electronic component and an electrical conductor operatively connected to the heat sink and configured to provide electrical contact between the heat sink and a surface of a conductive enclosure housing the electronic component, thereby dissipating heat generated by the electronic component and at least partially shielding electromagnetic radiation generated by the electronic component.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features may be arbitrarily expanded or reduced for clarity. Included in the drawing are the following figures.

DETAILED DESCRIPTION OF THE INVENTION

Figure 1:
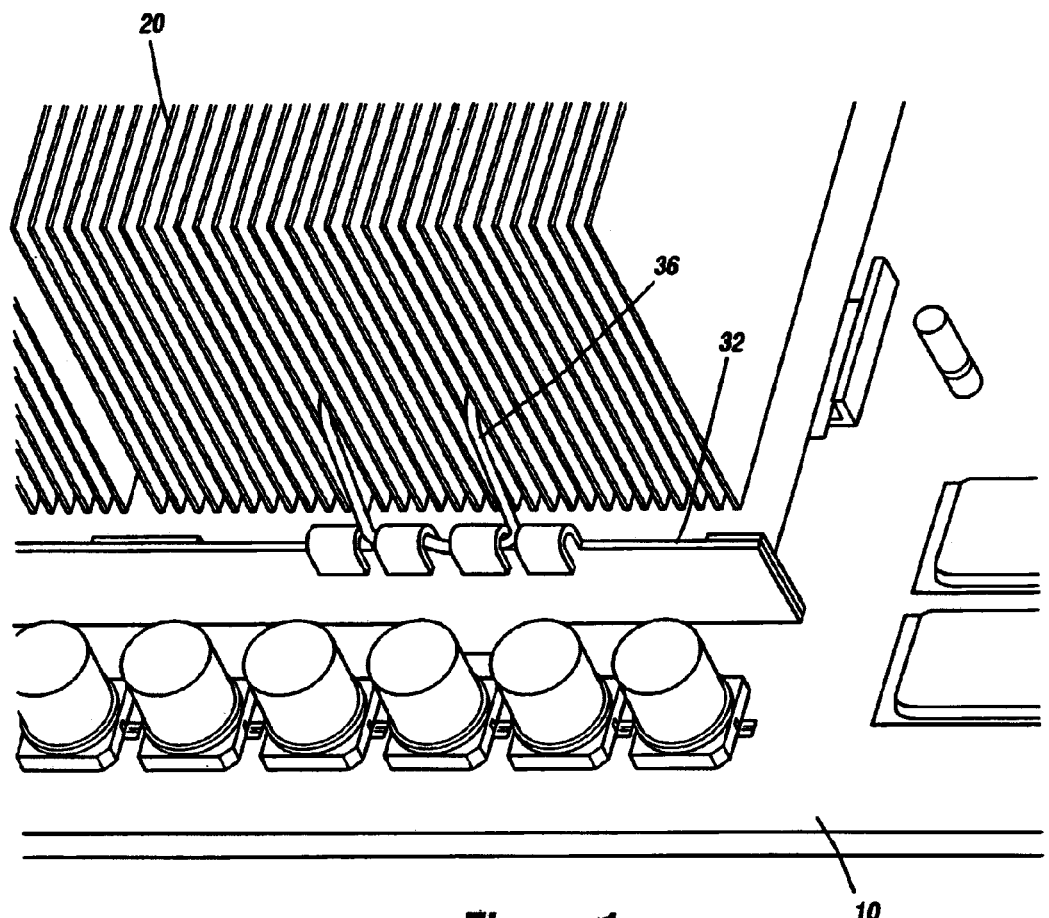
FIG. 1 is a perspective view of an exemplary apparatus configured to dissipate heat from an electronic component and to provide EMI shielding according to aspects of the present invention.

Referring now to the drawing, in which like reference numbers refer to like elements throughout, FIGS. 1–8 shows an exemplary apparatus 1 for dissipating heat from an electronic component 12 (in FIG. 6) and providing shielding for electromagnetic radiation to prevent electromagnetic interference (EMI). Apparatus 1 comprises a heat sink 20 having a base and a plurality of fins. The base comprises a thermally and electrically conductive material, preferably aluminum. It is configured to be mounted on a first side 11 of a circuit board 10, overlying an electronic component 12 (in FIG. 6). Heat sink 20 is mounted in abutting contact with the electronic component to provide thermal conduction between heat sink 20 and electronic component 12, which underlies heat sink 20. Optionally, heat sink 20 may be further configured to provide electrical contact between heat sink 20 and electronic component 12. The fins also comprise a thermally and electrically conductive material, preferably aluminum. The fins and the base may be integrally formed, such as from a single extrusion. The fins extend from the base to dissipate heat generated by the electronic component. Airflow may be provided parallel to the fins to facilitate heat dissipation.

Figure 2:
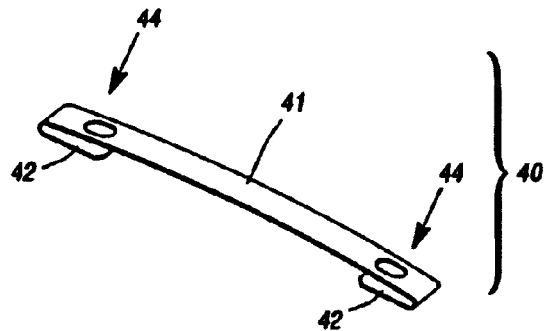
FIG. 2 is a perspective view of an embodiment of a spring contact of the apparatus shown in FIG. 1.
Figure 6:
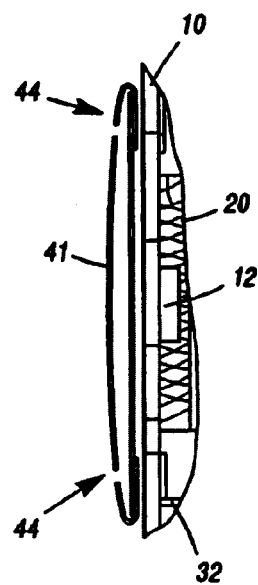
FIG. 6 is a sectional view of a portion of the circuit board and spring contact of FIG. 5 taken generally along axis 6—6.

Apparatus 1 further comprises a contact spring 40, as shown in FIG. 2. Contact spring 40 is an electrical conductor operatively connected to heat sink 20 and configured to provide electrical contact between heat sink 20 and a surface of a conductive enclosure (50 in FIGS. 7 and 8), in which circuit board 10 is installed. In the exemplary embodiment shown in FIGS. 1–8, spring contact 40 is formed from a conductive metal strip, comprising for example, beryllium copper, nickel-plated steel, or the like. Spring contact is formed with a convex curve 41 along its length. Both ends 42 of spring contact 40 are turned under convex curve 41 and have fastener openings (not shown) configured to accommodate a screw or other fastener. As shown in FIG. 6, spring contact 40 is mounted to a second side 13 of circuit board 10 with ends 42 flush to the surface of the circuit board. Convex curve 41 extends away from circuit board 10. As best seen in FIG. 2, access holes 44 are formed in convex curve 41 corresponding to the fastener openings on ends 42, providing access to fasteners used to mount spring contact 40 to circuit board 10. As will be explained in greater detail hereafter, convex curve 41 of spring contact 40 extends away from circuit board 10 and into frictional contact with the conductive enclosure. The spring force of spring contact 40 yieldingly urges it into contact with the enclosure to form an electrical connection.

Heat sink 20 and spring contact 40 are mounted onto opposite sides 11 and 13, respectively, of a circuit board 10 by one or more electrically conductive fastener systems that extend through circuit board 10 and engage both heat sink 20 and spring contact 40. An electrical connection is formed by fastener system between heat sink 20 and spring contact 40. This fastener system may comprise an assembly as shown in FIGS. 1–8, exemplary embodiments of which are disclosed in co-pending patent application 10/390,244, incorporated herein by reference. Alternatively, the fastener may comprise a screw configured to engage openings in spring contact and to provide threaded engagement with a threaded aperture in heat sink 20.

Figure 3:
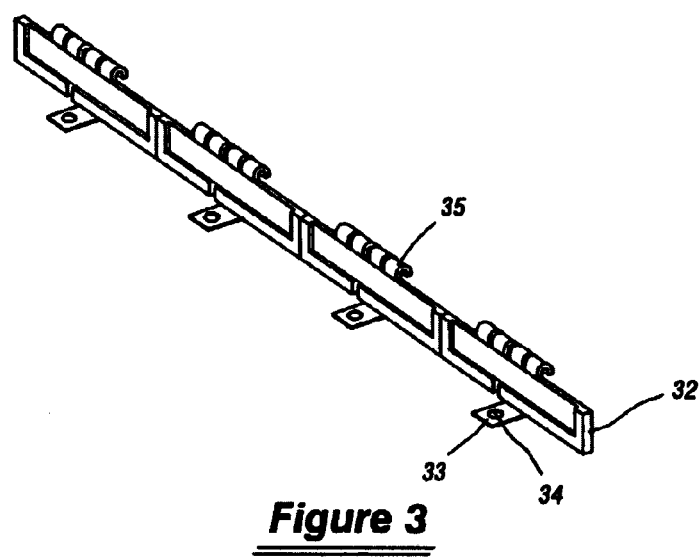
FIG. 3 is a detail view of a portion of an exemplary embodiment of a fastener for the apparatus in FIG. 1.
Figure 4:
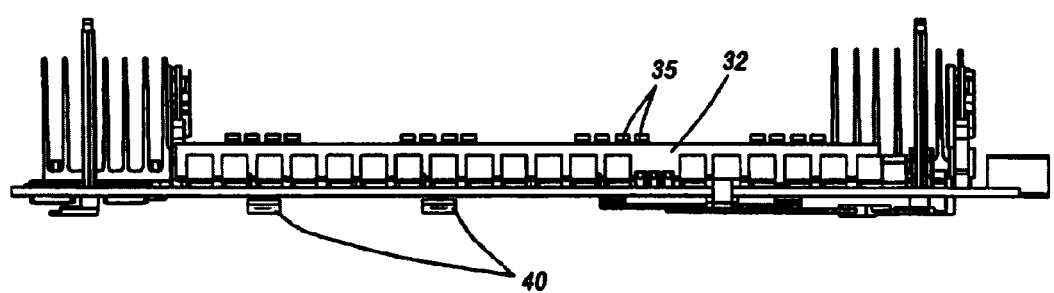
FIG. 4 is a front view of an exemplary embodiment of a circuit board, showing the spring contact of FIG. 2 and the portion of the fastener of FIG. 3 mounted on the circuit board according to an exemplary embodiment of the present invention, and with the heat sink omitted.
Figure 5:
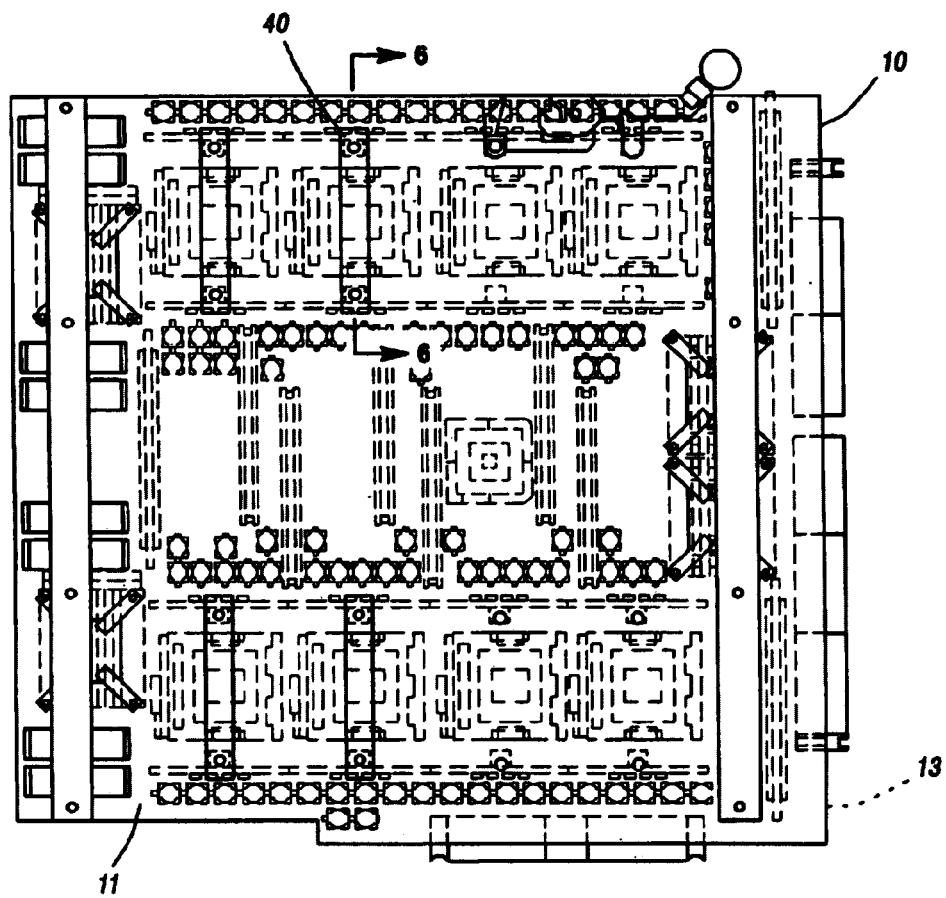
FIG. 5 is a bottom view of the circuit board shown in FIG. 4, showing the spring contact of FIG. 2 mounted thereon.

As shown in FIGS. 1 and 3, a rail 32 may be fastened to first side 11 of circuit board 10 to hold heat sink 20 in abutting contact with the electronic component. Rail 32 comprises one or more mounting tabs 33 with weld nuts 34 for mounting rail 32 on circuit board 10. Rail 32 extends away from circuit board 10 and terminates in hooks 35. A spring clip 36 engages hooks 35 on opposite sides of heat sink 20 and engages heat sink 20 between fins to secure heat sink 20 in place. As shown in FIG. 4, a screw 38 engages each mounting tab 33, extends through circuit board 10, and engages spring contact 40. Rails 32, spring clip 36, and screw 38 are electrically conductive, providing electrical contact between heat sink 20 and spring contact 40.

Alternatively, heat sink 20 may be electrically connected, directly or indirectly, to enclosure 50 using another exemplary conductor. For example, connector pins (not shown) may be used to provide an electrical contact with another assembly, such as a backplane, which may be bolted to enclosure 50.

Figure 7:
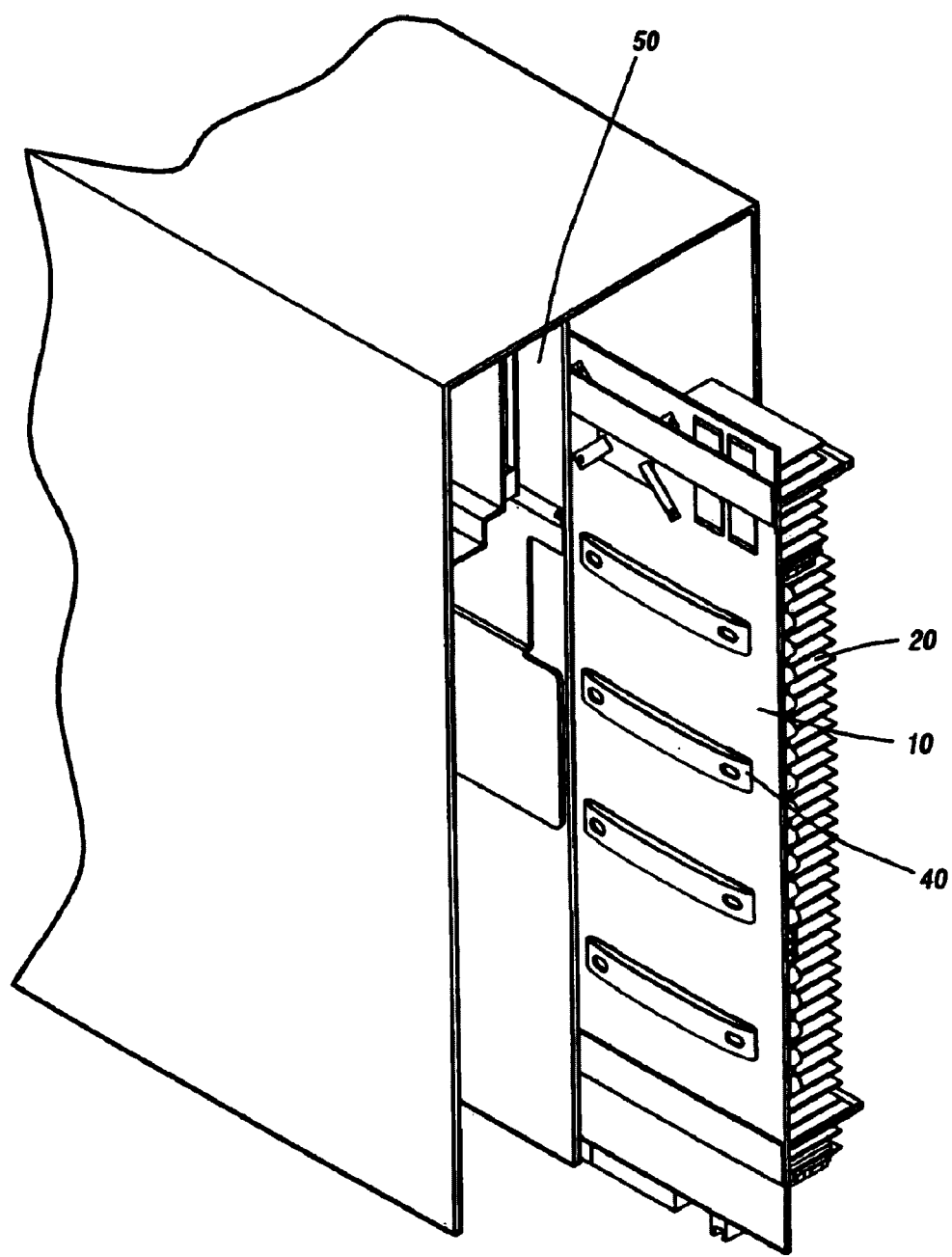
FIG. 7 is a perspective view of the circuit board of FIGS. 4–6 with an exemplary apparatus for dissipating heat from an electronic component and providing EMI shielding partially inserted into a conductive enclosure according to an exemplary embodiment of the present invention.
Figure 8:
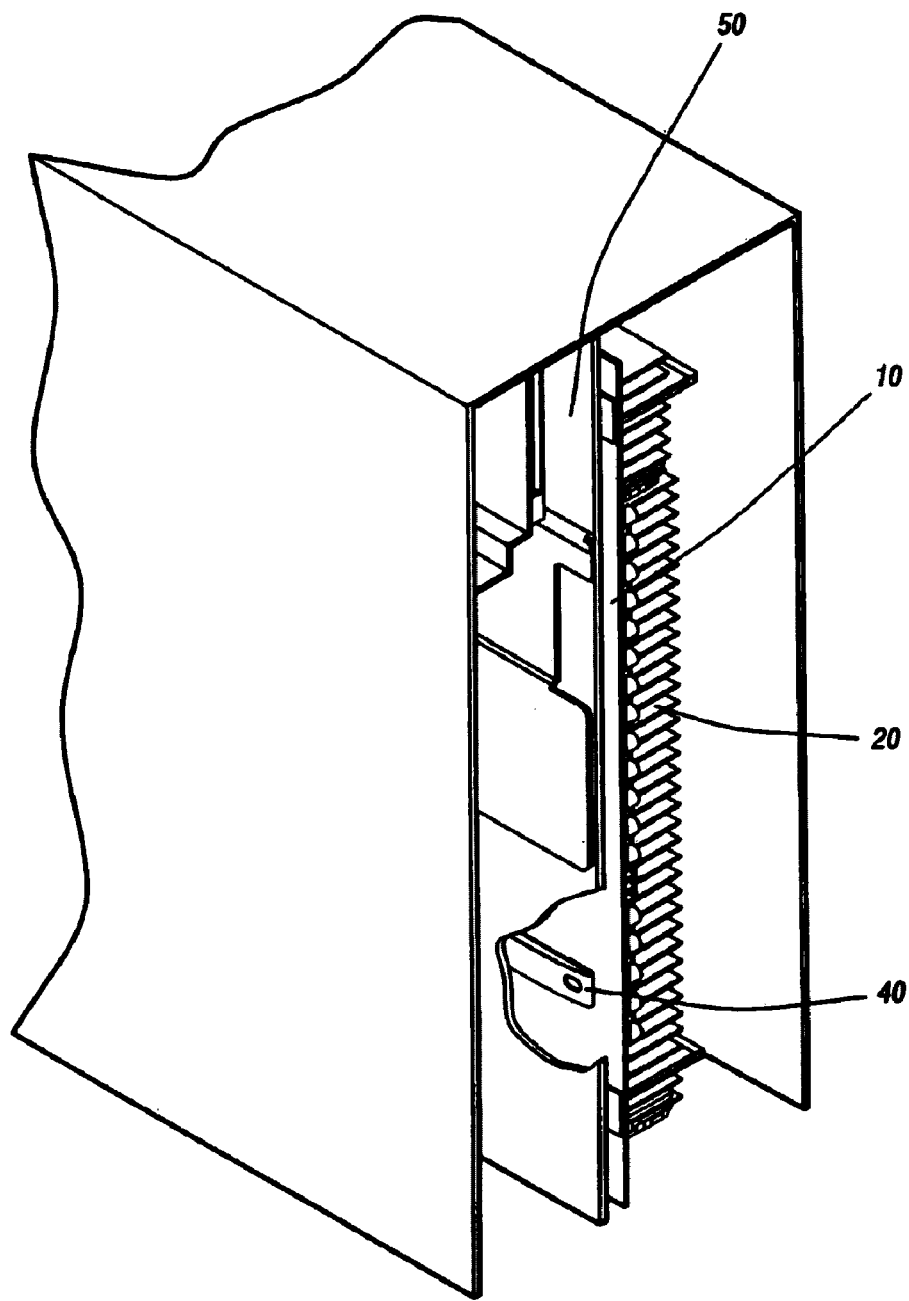
FIG. 8 is a perspective view of the circuit board and exemplary apparatus of FIG. 7 fully inserted into the conductive enclosure.

As shown in FIGS. 7 and 8, circuit board 10 is installed into an electrically grounded conductive enclosure 50 after heat sink 20 and spring contact 40 are mounted onto circuit board 10. Circuit board 10 is installed by sliding it into conductive enclosure 50. Spring contact 40 is mounted on second side 12 extending toward conductive enclosure 50. A gap is provided between first side 11 of circuit board 10, having heat sink 20 mounted on it, and conductive enclosure 50, which allows airflow through and over the fins of heat sink 20. Second side of circuit board 10 has exposed electronics such as solder pads, traces, and the like. Non-conductive pads (not shown) are provided to prevent conductive enclosure 50 from electrically shorting these exposed electronics. Spring contacts 40 extend beyond these pads to provide frictional contact with conductive enclosure 50. As circuit board 10 slides into conductive enclosure 50, spring contacts 40 are compressed by contact with conductive enclosure 50. Spring contacts 40 are oriented so that the sliding friction between them and conductive enclosure 50 is directed along their length, which is formed into a convex curve 41. By orienting the sliding friction along the convex curve 41 the force applied to spring contact 40 during installation is minimized. The possibility of spring contact 40 catching on a surface anomaly on conductive enclosure 50 is also minimized. Optionally, spring contact may also be formed with a convex curve transverse its length to prevent excess friction or catching during any movement of circuit board 10 that is not directed along the length of spring contacts 40.

As spring contacts 40 are compressed, they apply a yielding spring force against conductive enclosure 50, providing a frictional contact between spring contact 40 and conductive enclosure 50. Conductive enclosure 50 is electrically grounded for EMI shielding, and this frictional contact electrically grounds spring contact 40. An ungrounded heat sink can act as an antenna, attenuating and increasing electromagnetic radiation. Since the fastener system and heat sink 20 are in electrical contact with spring contact 40, however, heat sink 20 is also electrically grounded. Thus, electrically grounded heat sink 20 provides EMI shielding for the underlying electronic component, proximate the source of the electromagnetic radiation.

Although the present invention has been illustrated and described with reference to a conductor operatively connected to the heat sink by a fastener system extending through a circuit board, other embodiments are contemplated within the scope of the invention. An exemplary conductor for grounding a heat sink to a side wall of a grounded conductive enclosure is disclosed in U.S. patent application Ser. No. 09/525,411, incorporated herein by reference.

Although the invention is illustrated and described herein with reference to specific embodiments, the invention is not intended to be limited to the details shown. Rather, various modifications may be made in the details within the scope and range of equivalents of the claims and without departing from the invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. An apparatus for dissipating heat from an electronic component mounted on a circuit board in an electrically grounded conductive enclosure and for shielding electromagnetic radiation generated by the electronic component, said apparatus comprising:
   a heat sink configured to be mounted in thermal contact with said electronic component; and
   a spring contact operatively connected to said heat sink and configured to provide electrical contact between said heat sink and the conductive enclosure, thereby at least partially shielding the electromagnetic radiation generated by the electronic component;
   wherein said heat sink is mounted on a first side of the circuit board and said spring contact is mounted on a second side of the circuit board by a conductive fastener system extending through the circuit board.

2. The apparatus of claim 1 wherein said spring contact comprises a conductive metallic strip formed with a convex curve along its length and mounted to the circuit board at one or more of its ends.

3. The apparatus of claim 2 wherein both ends of said spring contact are bent under the convex curve and configured to be mounted to the circuit board by said conductive fastener system.

4. The apparatus of claim 3 wherein said ends of said spring contact are mounted to said circuit board by conductive screws in electrical contact with said heat sink.

5. The apparatus of claim 1 further comprising a mounting system for mounting the heat sink on the circuit board.

6. The apparatus of claim 5 wherein the mounting system comprises electrically conductive rails mounted to the circuit board and electrically conductive clips operatively associated with the rails and engaging the heat sink.

7. An apparatus configured to be mounted on a circuit board within an electrically grounded conductive enclosure and adapted to dissipate heat from an electronic component mounted on the circuit board and to shield electromagnetic radiation generated by the electronic component, the apparatus comprising:
   a thermally and electrically conductive heat sink configured to be mounted on a first side of the circuit board overlying the electronic component and in thermal contact with the electronic component to dissipate heat generated by the electronic component;
   at least one electrically conductive spring contact mounted on a second side of the circuit board, opposite the first side of the circuit board and configured to extend away from the circuit board into frictional contact with the conductive enclosure; and
   at least one electrically conductive fastener system configured to extend through the circuit board and engage the spring contact and the heat sink, thereby mechanically mounting the apparatus on the circuit board and grounding the heat sink to shield electromagnetic radiation generated by the electronic component.

8. The apparatus of claim 7 wherein said spring contact comprises a conductive metallic strip formed with a convex curve along its length and mounted to the circuit board at one or more of its ends.

9. The apparatus of claim 8 wherein both ends of said spring contact are bent under the convex curve and configured to be mounted to the circuit board by said conductive fastener system.

10. The apparatus of claim 9 wherein said ends of said conductive spring are mounted to said circuit board by conductive screws in electrical contact with said heat sink.

11. The apparatus of claim 8 wherein said spring contact further comprises a convex curve transverse its length.

12. The apparatus of claim 7 wherein said electronic component is a computer processor.

13. A processor assembly adapted to maintain a safe operating temperature for an electronic component therein and to provide shielding of electromagnetic radiation generated by the electronic component, the processor assembly comprising:
   an electrically grounded conductive enclosure;
   a circuit board mounted within said conductive enclosure;
   an electronic component mounted on a first side of said circuit board and adapted for processing digital signals;
   a thermally and electrically conductive heat sink overlying said electronic component and in thermal contact with said electronic component;
   an electrically conductive spring contact disposed on a second side of said circuit board and adapted to extend outwardly from said circuit board into frictional contact with said conductive enclosure; and
   at least one electrically conductive fastener system extending through said circuit board and engaging said heat sink and said spring contact, thereby mounting said heat sink to said circuit board and grounding said heat sink to provide shielding for electromagnetic radiation generated by said electronic component.

14. The processor assembly of claim 13 wherein said spring contact comprises a conductive metallic strip formed with a convex curve along its length and mounted to the circuit board at one or more of its ends.

15. The processor assembly of claim 14 wherein both ends of said spring contact are bent under the convex curve and configured to be mounted to the circuit board by said conductive fastener system.

16. The processor assembly of claim 13 wherein said fastener system comprises an electrically screw extending through an aperture in said circuit board.

17. A method for dissipating heat from an electronic component and shielding electromagnetic radiation generated by the electronic component, the method comprising the steps of:
   positioning an electrically conductive heat sink on a first side of a circuit board overlying an electronic component mounted on the circuit board;
   mounting an electrically conductive spring contact on a second side of the circuit board by an electrically conductive fastener system extending through the circuit board;
   fastening the heat sink to the electrically conductive fastener system; and
   installing the circuit board into a grounded conductive enclosure with the spring contact in frictional contact with the conductive enclosure.

18. The method of claim 17 wherein the engaging step comprises mounting ends of a metallic strip to the circuit board and extending a body of the metallic strip along a convex curve away from the circuit board, thereby providing frictional contact with the electrically grounded conductive enclosure.

19. The method of claim 18 wherein the step of installing the circuit board into a grounded conductive enclosure includes sliding the circuit board into the enclosure in a direction along the length of the spring contact.

20. The method of claim 17 wherein the step of engaging an electrically conductive spring contact with an electrically conductive fastener system comprises mounting a portion of the fastener system to the circuit board and fastening the heat sink to the portion of the fastener system mounted to the circuit board.

* * * * *